(12) United States Patent
Muth et al.

(10) Patent No.: US 7,288,858 B2
(45) Date of Patent: Oct. 30, 2007

(54) CIRCUIT ARRANGEMENT FOR CONTROLLING A SENSOR

(75) Inventors: Michael Muth, Stelle (DE); Adrian Harmansa, Hamburg (DE)

(73) Assignee: NXP B.V., Eindhoven (NL)

( * ) Notice: Subject to any disclaimer, the term of this patent is extended or adjusted under 35 U.S.C. 154(b) by 261 days.

(21) Appl. No.: 10/486,770

(22) PCT Filed: Aug. 19, 2002

(86) PCT No.: PCT/IB02/03319

§ 371 (c)(1),
(2), (4) Date: Feb. 11, 2004

(87) PCT Pub. No.: WO03/016827

PCT Pub. Date: Feb. 27, 2003

(65) Prior Publication Data

US 2004/0207268 A1    Oct. 21, 2004

(30) Foreign Application Priority Data

Aug. 17, 2001 (DE) .................... 101 40 517

(51) Int. Cl.
H03K 17/82 (2006.01)
(52) U.S. Cl. ...................................... 307/413

(58) Field of Classification Search ................. 307/413
See application file for complete search history.

(56) References Cited

U.S. PATENT DOCUMENTS

| | | | |
|---|---|---|---|
| 5,390,054 A | | 2/1995 | Youngquist et al. .......... 360/66 |
| 5,428,964 A | * | 7/1995 | Lobdell ..................... 62/176.6 |
| 5,767,591 A | * | 6/1998 | Pinkerton .................... 307/64 |
| 6,163,425 A | * | 12/2000 | Isokawa et al. .............. 360/66 |
| 6,166,635 A | * | 12/2000 | Huang ........................ 340/571 |
| 6,430,765 B1 | * | 8/2002 | Ozarowski et al. ............ 5/689 |

FOREIGN PATENT DOCUMENTS

| | | |
|---|---|---|
| EP | 0866453 | 9/1998 |
| JP | 08297806 | 11/1996 |
| JP | 09073620 | 3/1997 |

* cited by examiner

*Primary Examiner*—Michael Sherry
*Assistant Examiner*—Dru Parries
(74) *Attorney, Agent, or Firm*—Peter Zawilski

(57) ABSTRACT

To provide a circuit arrangement for controlling a sensor by means of a power supply source which is connected to input terminals of the sensor, and an evaluation circuit which is connected to output terminals of the sensor, by means of which the current consumption of a sensor in the standby state can be reduced in a simple manner, the power supply source (14) is switchable between at least two current levels in dependence upon an output signal level (S) of the sensor (12).

8 Claims, 1 Drawing Sheet

CIRCUIT ARRANGEMENT FOR CONTROLLING A SENSOR

Figure 1:
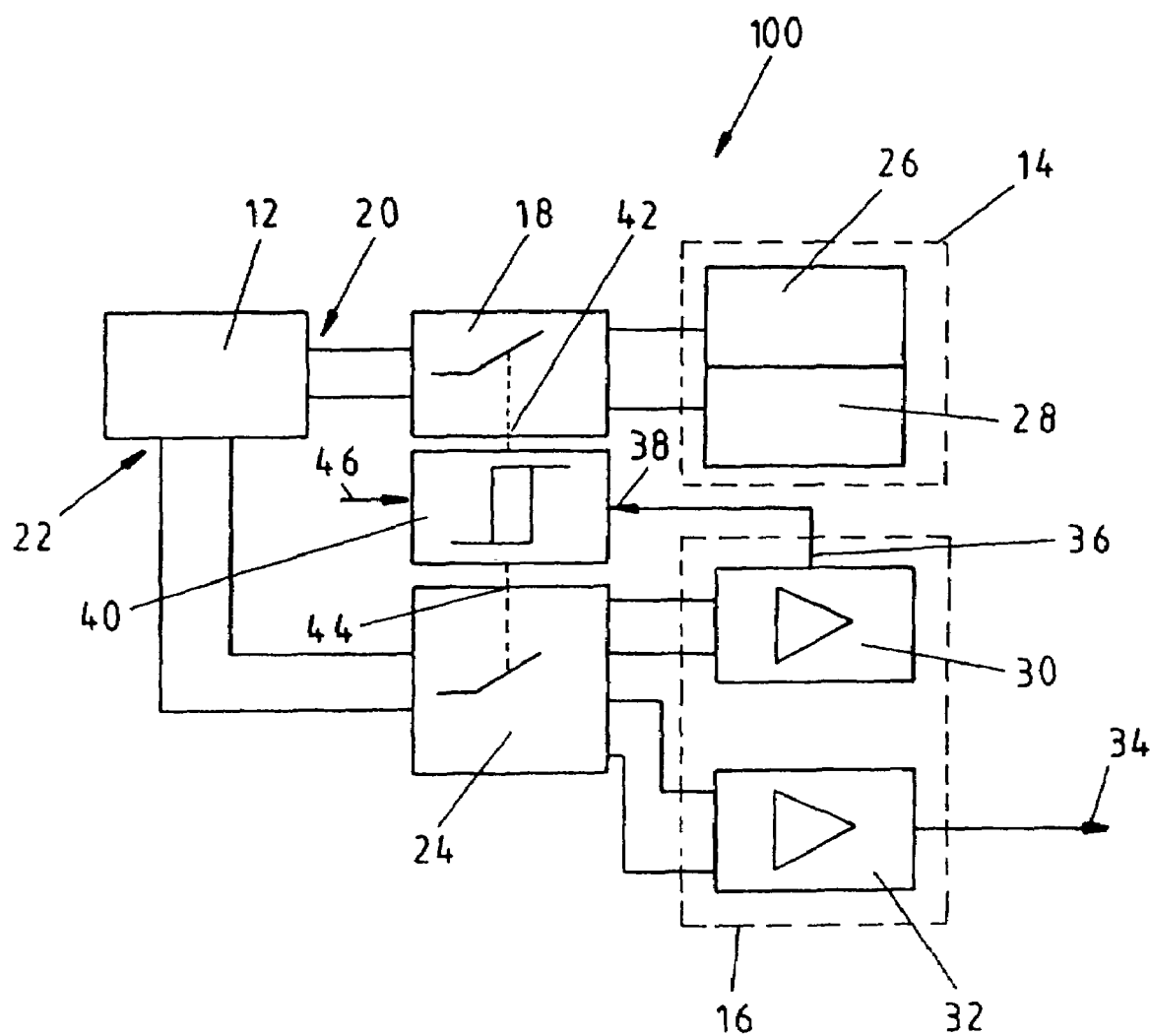

The invention relates to a circuit arrangement for controlling a sensor, the circuit arrangement comprising a power supply source which is connected to input terminals of the sensor, and an evaluation circuit which is connected to output terminals of the sensor, as well as to a sensor comprising the circuit arrangement.

Circuit arrangements of the type described above are known. The passive sensors referred to comprise, for example, at least one magnetoresistive resistor which can be impressed with a power supply voltage. When an external magnetic field acts on the magnetoresistive resistor, it changes its resistance so that it leads to a change of the output voltage of the magnetoresistive sensor. This change of the output voltage can be detected via an evaluation circuit and a corresponding event signal can be generated.

Such magnetoresistive sensors are used in, for example, angle measurement or path measurement. In different applications, there is no continuous measurement but a measurement which takes place with large time intervals, i.e. discontinuously. However, to ensure the full functioning capability of the magnetoresistive sensors also at the discontinuous instants, which may not be known, they are constantly connected to the power supply source. This has the drawback that a relatively high power supply voltage is required for a high output signal level of the magnetoresistive sensor, which high power supply voltage leads to a correspondingly high current consumption. Known magnetoresistive sensors have, for example, a resistance of 5 kΩ. This would lead to a current consumption of 1 mA at an assumed power supply voltage of 5 V. This current also flows when the magnetoresistive sensor element is only in a standby state.

It is an object of the invention to provide a circuit arrangement of the type described hereinbefore, by means of which the current consumption of a sensor in the standby state can be reduced in a simple way.

According to the invention, this object is solved by a circuit arrangement as defined in claim 1. Since the power supply source is switchable between at least two current levels in dependence upon an output signal level of the sensor, it is advantageously achieved that, in spite of initial impression of the sensor with a lower power supply voltage, this sensor maintains its sensing function during the standby state. It is true that the impression with a lower power supply voltage leads to a reduction of an output signal level of the sensor, but this smaller output signal level is sufficient to recognize the approximation of an event to be detected, for example, an external magnetic field, for example, in the case of an angle measurement or path measurement. When this approximation of the event to be detected is recognized, a switch to a higher power supply voltage (standard power supply voltage) is effected, by which the nominal output voltage of the sensor is directly ensured. It will be evident that, for example, a change or movement of an angle can be initially detected by way of a small current consumption of the sensor without the full functioning capability of the sensor being affected during its actual measurement. It is particularly advantageous that no layout changes for realizing this standby function need to be performed on the sensor element itself so that standard sensors can be used.

In a preferred embodiment of the invention, the power supply source is connected to the sensor via a switch, while a control terminal of the switch is controllable by the evaluation circuit of the sensor. As a result, a combination of switching the power supply voltage source between the at least two current levels and the evaluation circuit will be possible in a simple way. Particularly, the switch of the power supply source to the higher current level and thus the increase of the output signal level of the sensor can thus be directly realized immediately after an event to be detected has been recognized.

In a further preferred embodiment of the invention, the evaluation circuit comprises at least two measuring channels of different sensitivity, in which a measuring channel having a lower sensitivity serves to control the switch assigned to the power supply source. It is thereby achieved advantageously that the sensor is initially provided with a minimum output signal level which is sufficient for recognizing the movement. Particularly when, in a further preferred embodiment of the invention, the measuring channel having the lower sensitivity is used simultaneously for switching the evaluation circuit to a measuring channel having a higher sensitivity, it is ensured in a simple way that, in addition to a switch of the power supply to a higher current level, the sensing sensitivity of the sensor is simultaneously enhanced when an event has been detected. In spite of a small current consumption realized in the standby state (sleep mode), an immediate, complete functioning capability of the sensor at the desired high output level of the sensor is ensured in the operating state.

Moreover, a preferred embodiment of the invention is characterized in that the first switch for switching the power supply source and the second switch for switching the measuring channels of the evaluation circuit are controlled by a common triggering means which is preferably constituted as a Schmitt trigger. As a result, the combination of switching the power supply source with the switching of the output circuit will be possible by taking small circuit-technical measures.

Further preferred embodiments of the invention are defined in the dependent claims.

These and other aspects of the invention are apparent from and will be elucidated with reference to the embodiments described hereinafter.

IN THE DRAWING

The sole FIGURE is a block diagram of a circuit arrangement of a magnetoresistive sensor.

The FIGURE shows a circuit arrangement 100 for controlling a magnetoresistive sensor 12. The circuit arrangement 100 comprises a power supply source 14 and an evaluation circuit 16.

The power supply source 14 is connected to input terminals 20 of the magnetoresistive sensor 12 via a first switch 18. Output terminals 22 of the magnetoresistive sensor 12 are connected to the evaluation circuit 16 via a second switch 24.

The power supply source 14 comprises a first current source 26 and a second current source 28, the current source 26 providing a power supply current which is lower than that provided by the current source 28. A power supply current $I_v$ of the current source 26 is, for example, 10 μA. A power supply current $I_v$ of the current source 28 is, for example, 1 mA. A resistor of the magnetoresistive sensor 12 is assumed to have a value of, for example, 10 kΩ.

The evaluation circuit 16 comprises a first measuring channel 30 and a second measuring channel 32. The measuring channel 30 comprises an amplifier with an integrated high-pass filter. The measuring channel 32 comprises a precision amplifier and is connected to a signal terminal 34.

An output terminal 36 of the measuring channel 30 is connected to an input terminal 38 of a triggering means 40. The triggering means 40 is, for example, a Schmitt trigger. The triggering means 40 is connected to control terminals 42 and 44 of the switches 18 and 24, respectively.

The circuit arrangement 100 shown in the FIGURE has the following function.

In the standby state (sleep mode) of the magnetoresistive sensor 12, its input terminals 20 are connected to the current source 26 via the switch 18. Simultaneously, the output terminals 22 are connected to the measuring channel 30 via the switch 24. In this switching state, the magnetoresistive sensor 12 is fed with a lower power supply current $I_v$ of, for example, 10 μA. At a resistance of 10 kΩ of the magnetoresistive sensor 12, a power supply voltage $U_v$ of 100 mV is obtained. While taking a sensitivity of 12 mV/V of the magnetoresistive sensor 12 into account, an output signal S=12 mV/V×0.1 V=1.2 mV is obtained. The output signal with this signal amplitude is present at the measuring channel 30 via the switch 24. This output signal of the sensor 12 in the standby state is passed via the integrated high-pass filter so that the signal changes not resulting from a movement to be detected, for example, drift signals of an offset of the sensor 12 can be compensated. This is particularly also possible because a movement to be detected must have a minimal speed so that, due to the passage of the signal through a high-pass filter, it is very well possible to distinguish between this minimal speed and possible signal drifts.

When the magnetoresistive sensor 12 recognizes a movement to be detected, this will lead to a relatively rapid change of the signal level of the output signal S of the sensor 12. This signal is passed on to the triggering means 40 via the measuring channel 30. When the signal amplitude exceeds a predeterminable threshold value, the switches 18 and 24 are triggered via the triggering means 40 so that the power supply source 14 switches to the current source 28 and the evaluation circuit 16 switches to the measuring channel 32. Consequently, the magnetoresistive sensor 12 is fed with a higher current level so that the output signal level of the sensor 12 corresponds to the desired value. This switching state of the circuit arrangement 100 corresponds to the operating state. A corresponding signal corresponding to the movement now detected is passed on via the signal terminal 34 of the measuring channel 32 to a co-ordinate circuit or the like. This co-ordinate circuit may simultaneously generate a reset signal after the movement recognition has been terminated, which reset signal causes the switches 18 and 24 to switch the magnetoresistive sensor 12 to its standby state again. This may be realized, for example, by a reset terminal 46 at the triggering means 40, as shown in the FIGURE.

The invention is not limited to the embodiment described. For example, the principle of switching the power supply source may also be used, for example, in capacitive sensors, inductive sensors, sensors comprising resistant strain gauges or the like.

LIST OF REFERENCE NUMERALS

100 circuit arrangement
12 magnetoresistive sensor
14 power supply source
16 evaluation circuit
18 first switch
20 input terminals
22 output terminals
24 second switch
26 first current source
28 second current source
30 first measuring channel
32 second measuring channel
34 signal terminal
36 output terminal
38 input terminal
40 triggering means
42 control terminal
44 control terminal
46 reset terminal

The invention claimed is:

1. A circuit arrangement for controlling a sensor, the circuit arrangement comprising a power supply source which is connected to input terminals of the senior, and an evaluation circuit which is connected to output terminals of the sensor,
    characterized in that the power supply source is switchable between at least two current levels of different magnitude in dependence upon an output signal level (S) of the sensor and that the power supply source comprises at least two current sources which are connected to the sensor via a switch, a control terminal of the switch being controllable by the evaluation circuit of the sensor; and
    characterized in that the evaluation circuit comprises at least two measuring channels of different sensitivity, wherein a first measuring channel having a lower sensitivity serves to control the switch.

2. A circuit arrangement as claimed in claim 1, characterized in that the first measuring channel comprises a high-pass filter for the sensor signal (S).

3. A circuit arrangement as claimed in claim 1, characterized in that the first measuring channel having the lower sensitivity simultaneously serves to switch the evaluation circuit to the a second measuring channel having a higher sensitivity.

4. A circuit arrangement for controlling a sensor, the circuit arrangement comprising a power supply source which is connected to input terminals of the sensor, and an evaluation circuit which is connected to output terminals of the sensor, characterized in that the power supply source is switchable between at least two current levels in dependence upon an output signal level (S) of the sensor characterized in that the output terminals of the sensor are connected to the evaluation circuit via second switch.

5. A circuit arrangement as claimed in claim 4, characterized in that the first switch and the second switch are controllable by a common triggering means.

6. A circuit arrangement as claimed in claim 5, characterized in that the triggering means is a Schmitt trigger which is controllable by the measuring channel having the lower sensitivity.

7. A circuit arrangement as chimed in claim 4, wherein the sensor is a passive sensor.

8. A sensor as claimed in claim 7, characterized in that the sensor is a magnetoresistive, capacitive, inductive and/or mechanical sensor.

* * * * *